United States Patent
Hayakawa (10) Patent No.: US 10,529,604 B2
(45) Date of Patent: Jan. 7, 2020

(54) SUBSTRATE POSITION ADJUSTMENT METHOD, STORAGE MEDIUM AND SUBSTRATE TREATMENT SYSTEM

(71) Applicant: Tokyo Electron Limited, Tokyo (JP)

(72) Inventor: Makoto Hayakawa, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 2 days.

(21) Appl. No.: 16/026,680

(22) Filed: Jul. 3, 2018

(65) Prior Publication Data

US 2019/0019701 A1 Jan. 17, 2019

(30) Foreign Application Priority Data

Jul. 14, 2017 (JP) .................................. 2017-138264

(51) Int. Cl.
| | | |
|---|---|---|
| *H01L 21/67* | (2006.01) | |
| *H01L 21/687* | (2006.01) | |
| *G03F 7/16* | (2006.01) | |
| *G03F 7/09* | (2006.01) | |
| *G06T 7/00* | (2017.01) | |
| *G03F 7/30* | (2006.01) | |

(52) U.S. Cl.
CPC ........ *H01L 21/67265* (2013.01); *G03F 7/091* (2013.01); *G03F 7/162* (2013.01); *G03F 7/3028* (2013.01); *G06T 7/0004* (2013.01); *H01L 21/67288* (2013.01); *H01L 21/68764* (2013.01); *G06T 2207/30148* (2013.01)

(58) Field of Classification Search
CPC combination set(s) only.
See application file for complete search history.

(56) References Cited

U.S. PATENT DOCUMENTS

| 8,135,486 B2* | 3/2012 | Shindo ............. H01L 21/67259 356/400 |
| 9,227,320 B2* | 1/2016 | Hiroki .............. H01L 21/67259 |
| 10,112,205 B2* | 10/2018 | Inagaki .................... B05B 9/03 |
| 2005/0150451 A1* | 7/2005 | Tanaka ............... H01L 21/6715 118/688 |
| 2008/0013089 A1* | 1/2008 | Ishii ...................... G03F 9/7011 356/400 |
| 2013/0084393 A1* | 4/2013 | Kashiyama ......... H01L 21/6715 427/273 |

FOREIGN PATENT DOCUMENTS

| JP | 2001-110712 A | 4/2001 |
| JP | 2014-67833 A | 4/2014 |

* cited by examiner

*Primary Examiner* — Kyle O Logan
(74) *Attorney, Agent, or Firm* — Posz Law Group, PLC (57) ABSTRACT

The method includes a step of executing a rotation treatment in a rotation treatment apparatus; a step of imaging a substrate on which the rotation treatment has been executed, in an inspection apparatus; a step of acquiring change amount information stored in advance, being information on an amount of change in orientation of the substrate while the substrate is moved from the rotation treatment apparatus to the inspection apparatus; a step of acquiring, as an execution result information, information on an execution result of the rotation treatment along a circumferential direction of the substrate, based on an imaging result in the inspection apparatus; and a step of correcting a position of the substrate at a time of the rotation treatment, based on the change amount information and the execution result information.

6 Claims, 10 Drawing Sheets

SUBSTRATE POSITION ADJUSTMENT METHOD, STORAGE MEDIUM AND SUBSTRATE TREATMENT SYSTEM

CROSS REFERENCE TO RELATED APPLICATIONS

This application is based upon and claims the benefit of priority of the prior Japanese Patent Application No. 2017-138264, filed in Japan on Jul. 14, 2017, the entire contents of which are incorporated herein by reference.

BACKGROUND OF THE INVENTION

1. Field of the Invention

The present invention relates to a substrate position adjustment method, a storage medium, and a substrate treatment system, for adjusting a position of a substrate at a time of a rotation treatment in the substrate treatment system including a rotation treatment apparatus configured to execute the rotation treatment, the rotation treatment being a predetermined treatment performed on the substrate while rotating the substrate.

2. Description of the Related Art

In a photolithography process in a manufacturing process of a semiconductor device, for example, a resist coating treatment of applying a resist solution onto a semiconductor wafer (hereinafter, referred to as a "wafer") to form a resist film, pattern exposure processing of exposing the resist film to a predetermined pattern, a developing treatment of developing the exposed resist film and so on are sequentially performed to form a predetermined resist pattern on the wafer. The series of treatments are performed in a coating and developing treatment system being a substrate treatment system equipped with various treatment apparatuses which treat the wafer, transfer mechanisms which transfer the wafer, a cassette mounting table on which a cassettes is mounted, the cassette housing wafers before the series of treatments and wafers after the series of treatments, and so on. Note that in the resist coating treatment, the resist film is formed by applying the resist solution to the wafer surface while rotating the wafer around an axis intersecting the wafer surface (hereinafter, an intersecting axis).

Examples of the coating and developing treatment system include the one equipped with an edge exposure apparatus that performs edge exposure processing (refer to Japanese Laid-open Patent Publication No. 2014-67833) and the one equipped with an inspection apparatus that performs so-called macro defect inspection. The edge exposure processing is processing of selectively exposing a peripheral portion of the resist film before pattern exposure processing, and in the macro defect inspection, the entire wafer surface is imaged by an imaging apparatus and the presence or absence of a defect on the wafer surface is determined based on the imaging result.

Note that if the wafer is transferred out of the edge exposure apparatus while keeping the orientation of the wafer at the time of transfer into the edge exposure apparatus, the orientation of the wafer is sometimes not suitable for pattern exposure processing at a subsequent stage. Therefore, the edge exposure apparatus has a transfer out-time orientation adjustment function of adjusting the orientation of the wafer at the time of transfer out of the edge exposure apparatus. Setting the orientation of the wafer at the time of transfer out of the edge exposure apparatus to a desired orientation can eliminate the adjustment of the orientation of the wafer in the exposure apparatus at the time of pattern exposure and shorten the processing time in the exposure apparatus.

Further, there is a coating and developing treatment system in which a function of performing, before exposure, an EBR (Edge Bead Removal) treatment of removing the resist film at the wafer peripheral portion is provided in a resist coating apparatus that performs a resist coating treatment (refer to Japanese Laid-open Patent Publication No. 2001-110712). In the EBR treatment in the resist coating apparatus, the resist film at the wafer peripheral portion is removed in an annular shape by supplying a solvent for the resist film to the wafer peripheral portion while rotating the wafer around the intersecting axis.

A removal width of the resist film in the EBR treatment is required to be constant along the circumferential direction of the wafer. This is because if the removal width is not constant, the resist film in a formation region of the semiconductor devices on the wafer is removed to possibly produce defective semiconductor devices.

In order to make the removal width in the EBR treatment constant as described above, the wafer at the time of EBR treatment is required to be aligned so that the center of the wafer coincides with the rotation axis of the wafer at the time of EBR treatment.

For alignment of the wafer, for example, a result of imaging the wafer after the EBR treatment for alignment, in the above-described inspection apparatus is used. More specifically, the alignment is performed by detecting the removal width at the time of EBR treatment along the circumferential direction of the wafer from the imaging result and correcting the position of the wafer at the time of EBR treatment to make the removal width constant based on the detection result.

Figure 10A:
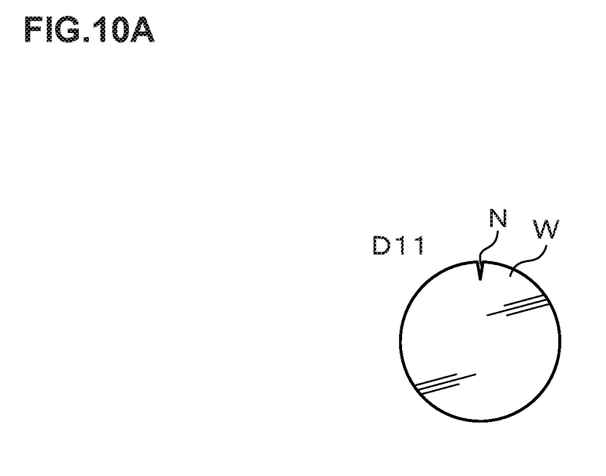
FIG. 10A is a view for explaining a conventional method for aligning the wafer at the time of EBR treatment, and illustrating an example of the orientation of the wafer at the time of transfer into the resist coating apparatus.
Figure 10B:
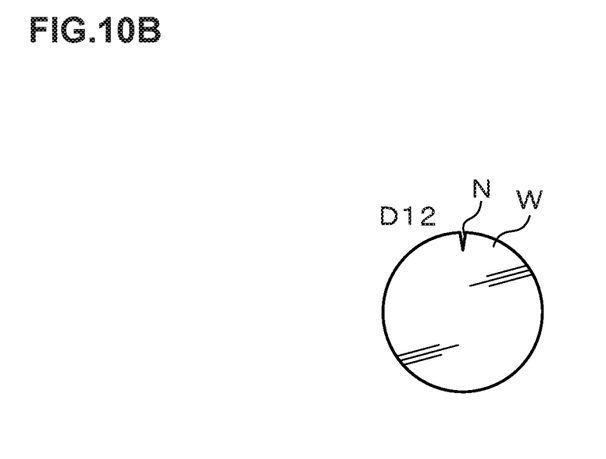
FIG. 10B is a view for explaining the conventional method for aligning the wafer at the time of EBR treatment, and illustrates an example of the orientation of the wafer at the time of imaging in the inspection apparatus.
Figure 11A:
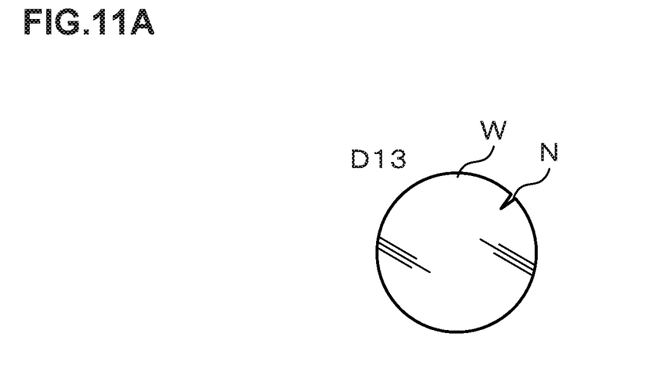
FIG. 11A is a view for explaining an adjustment step of the orientation of the wafer necessary for the conventional method for aligning the wafer at the time of EBR treatment, and illustrates an example of the orientation of the wafer in a cassette after adjustment of the orientation of the wafer by an edge exposure apparatus.
Figure 11B:
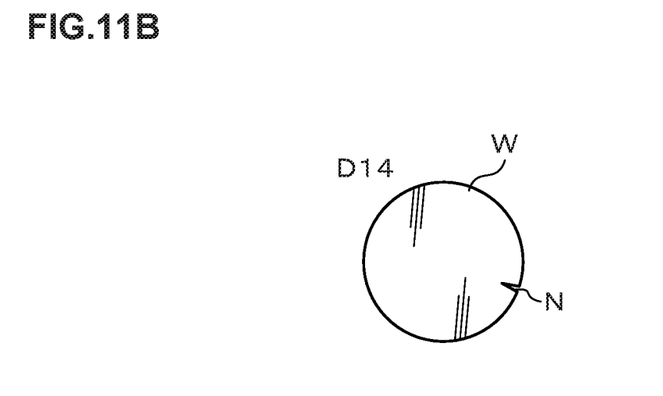
FIG. 11B is a view for explaining the adjustment step of the orientation of the wafer necessary for the conventional method for aligning the wafer at the time of EBR treatment, and illustrates an example of the orientation of the wafer at the time of transfer out of the edge exposure apparatus.
Figure 11C:
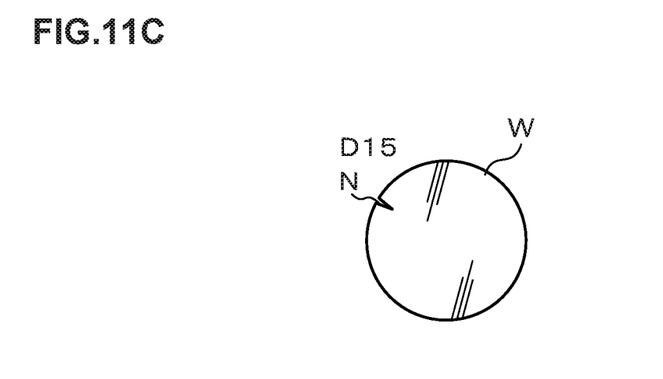
FIG. 11C is a view for explaining the adjustment step of the orientation of the wafer necessary for the conventional method for aligning the wafer at the time of EBR treatment, and illustrates an example of the orientation of the wafer in the cassette after adjustment of the orientation of the wafer by the edge exposure apparatus.

Further, before the alignment, adjustment of the orientation of the wafer is performed. The adjustment of the orientation of the wafer will be described using FIG. 10A, FIG. 10B, FIG. 11A, FIG. 11B, and FIG. 11C. FIG. 10A is a view illustrating an example of the orientation of the wafer at the time of transfer into the resist coating apparatus. FIG. 10B is a view illustrating an example of the orientation of the wafer at the time of imaging in the inspection apparatus. FIG. 11A is a view illustrating an example of the orientation of the wafer in a cassette (FOUP: Front Opening Unified Pod) after later-described adjustment of the orientation of the wafer by the edge exposure apparatus. FIG. 11B is a view illustrating an example of the orientation of the wafer at the time of transfer out of the edge exposure apparatus. FIG. 11C is a view illustrating an example of the orientation of the wafer in the cassette after adjustment of the orientation of the wafer by the edge exposure apparatus.

As illustrated in FIG. 10A and FIG. 10B, an orientation D11 of the wafer W at the time of transfer into the resist coating apparatus and an orientation D12 of the wafer W at the time of imaging in the inspection apparatus are adjusted to be the same in a predetermined orientation (an orientation where a notch N of the wafer W is located in a region of 0 o'clock in the example of the drawing) by adjustment of the orientation of the wafer W.

The orientation D12 of the wafer W at the time of imaging in the inspection apparatus is adjusted by an orientation adjustment function included in the inspection apparatus. Note that a conventional orientation adjustment function of the inspection apparatus cannot adjust the orientation of the wafer at the time of transfer out of the inspection apparatus.

On the other hand, the orientation D11 of the wafer W at the time of transfer into the resist coating apparatus is adjusted by setting the orientation of the wafer W in the cassette, in which the wafers before and after the coating and developing treatments are performed, to a desired orientation since the resist coating apparatus does not include the orientation adjustment function.

However, an orientation D13 of the wafer W in the cassette exemplified in FIG. 11A is an arbitrary. Accordingly, if the wafer W is transferred to the resist coating apparatus as it is without adjustment of the orientation D13 of the wafer W in the cassette, the orientation of the wafer at the time of transfer into the resist coating apparatus is not a desired orientation in some cases. Therefore, the wafer W is once transferred from the cassette into the edge exposure apparatus including the above-described transfer out-time orientation adjustment function, and an orientation D14 of the wafer W at the time of transfer out of the edge exposure apparatus is set to a specific orientation as illustrated in FIG. 11B. Then, the wafer W is transferred out of the edge exposure apparatus and returned into the cassette to thereby set an orientation D15 of the wafer W in the cassette to a desired orientation as illustrated in FIG. 11C.

In the case where the edge exposure apparatus is not installed in the coating and developing treatment system, the orientation of the wafer in the cassette is adjusted in another coating and developing treatment system in which the edge exposure apparatus is installed, and then the cassette is moved to the coating and developing treatment system requiring alignment of the wafer at the time of EBR treatment.

SUMMARY OF THE INVENTION

However, when the edge exposure processing is unnecessary, additionally providing the edge exposure apparatus in the coating and developing treatment system in order to adjust the orientation of the wafer leads to an increase in cost and size of the system. Further, using the other coating and developing treatment system in which the edge exposure apparatus is installed as described above requires time for movement of the cassette. Further, the adjustment itself of the orientation of the wafer in the cassette requires time. Accordingly, a long time is required for alignment of the wafer at the time of EBR treatment.

Japanese Laid-open Patent Publication No. 2014-67833 and Japanese Laid-open Patent Publication No. 2001-110712 do not disclose or suggest anything about the aforementioned points.

Further, the aforementioned points also apply to a rotation treatment other than the EBR treatment, for example, a treatment of forming an annular film along an outer edge of the wafer.

A technique according to this disclosure makes it possible, in consideration of the above circumstances, to perform alignment of a wafer at the time of a rotation treatment in a short time and at a low cost in a small-size substrate treatment system without providing a processing apparatus that adjusts the orientation of the wafer at the time of transfer out.

An aspect of the technique according to this disclosure is a substrate position adjustment method for adjusting a position of a substrate at a time of a rotation treatment in a substrate treatment system including a rotation treatment apparatus configured to execute the rotation treatment, the rotation treatment being a predetermined treatment performed on the substrate while rotating the substrate, the substrate treatment system including an inspection apparatus configured to image a front surface of the substrate for inspection of the substrate, the substrate position adjustment method including: a rotation treatment step of executing the rotation treatment in the rotation treatment apparatus; an imaging step of imaging the substrate on which the rotation treatment has been executed, in the inspection apparatus; a change amount information acquisition step of acquiring change amount information stored in advance, being information on an amount of change in orientation of the substrate while the substrate is moved from the rotation treatment apparatus to the inspection apparatus; a result information acquisition step of acquiring, as an execution result information, information on an execution result of the rotation treatment along a circumferential direction of the substrate, based on an imaging result at the imaging step; and a correction step of correcting the position of the substrate at the time of the rotation treatment, based on at least the change amount information and the execution result information.

An aspect of the technique according to this disclosure in another viewpoint is a computer-readable storage medium storing a program running on a computer of a control unit configured to control a substrate treatment system to cause the substrate treatment system to execute the substrate position adjustment method.

An aspect of the technique according to this disclosure in another viewpoint is a substrate treatment system including a rotation treatment apparatus configured to execute a rotation treatment, the rotation treatment being a predetermined treatment performed on the substrate while rotating the substrate, the substrate treatment system including: an inspection apparatus configured to image a front surface of the substrate for inspection of the substrate; and a control unit configured to adjust a position of the substrate at a time of the rotation treatment, wherein the control unit is configured to control, through control of the control unit, the rotation treatment apparatus and the inspection apparatus to execute: a rotation treatment step of executing the rotation treatment in the rotation treatment apparatus; and an imaging step of imaging the substrate on which the rotation treatment has been executed, in the inspection apparatus, so as to perform: a change amount information acquisition step of acquiring change amount information stored in advance, being information on an amount of change in orientation of the substrate while the substrate is moved from the rotation treatment apparatus to the inspection apparatus; a result information acquisition step of acquiring, as an execution result information, information on an execution result of the rotation treatment along a circumferential direction of the substrate, based on an imaging result at the imaging step; and a correction step of correcting the position of the substrate at the time of the rotation treatment, based on at least the change amount information and the execution result information.

In an aspect of the technique according to this disclosure, it is possible to perform alignment of a wafer at the time of a rotation treatment in a short time and at a low cost in a small-size substrate treatment system without providing a processing apparatus that adjusts the orientation of the wafer at the time of transfer out.

DETAILED DESCRIPTION OF THE INVENTION

Hereinafter, an embodiment of the present invention will be described. Note that in this description and the drawings, components having substantially the same functional configurations are denoted by the same reference numerals to omit duplicated explanation.

Figure 1:
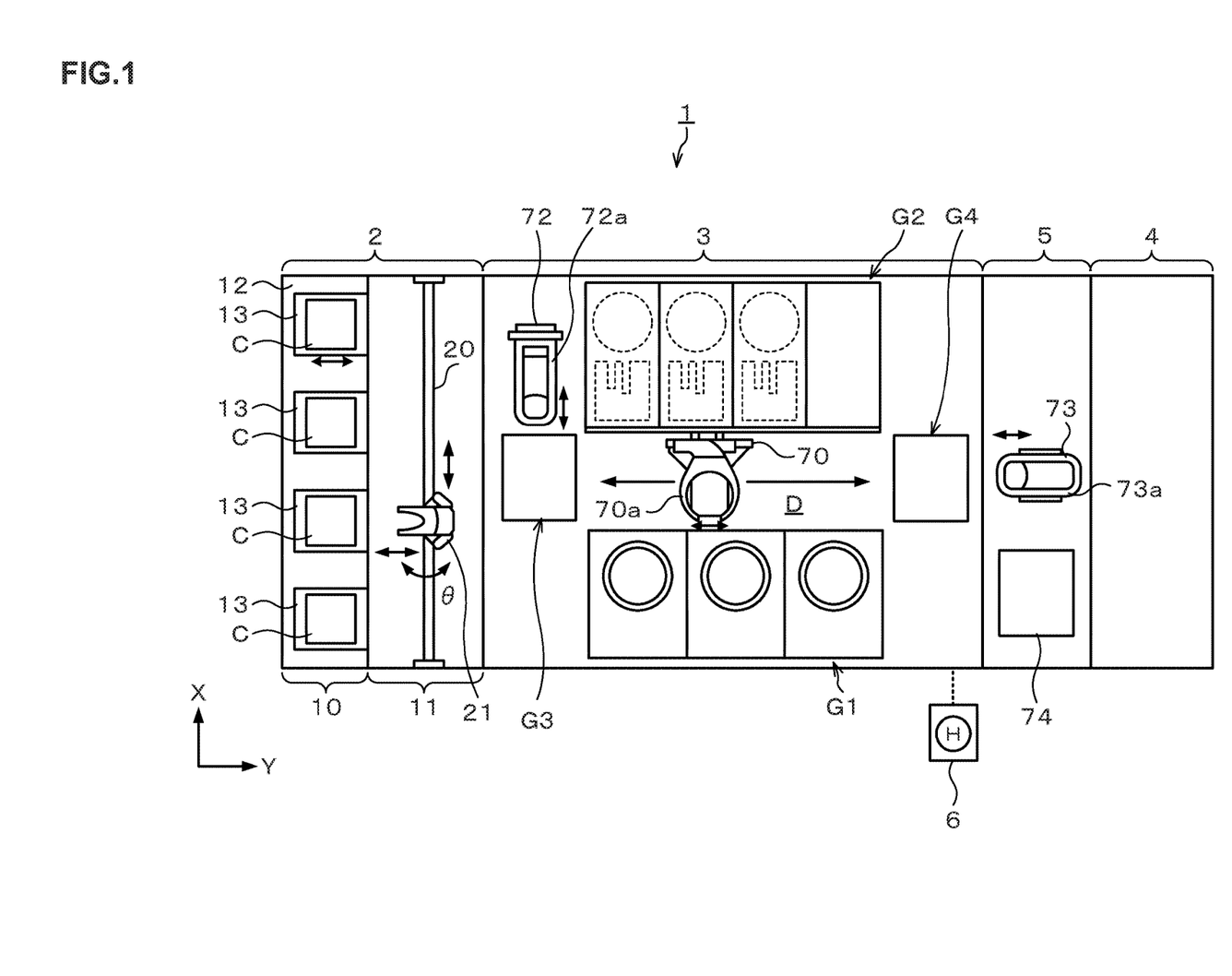
FIG. 1 is a plan view illustrating the outline of a configuration of a coating and developing treatment system according to this embodiment.
Figure 2:
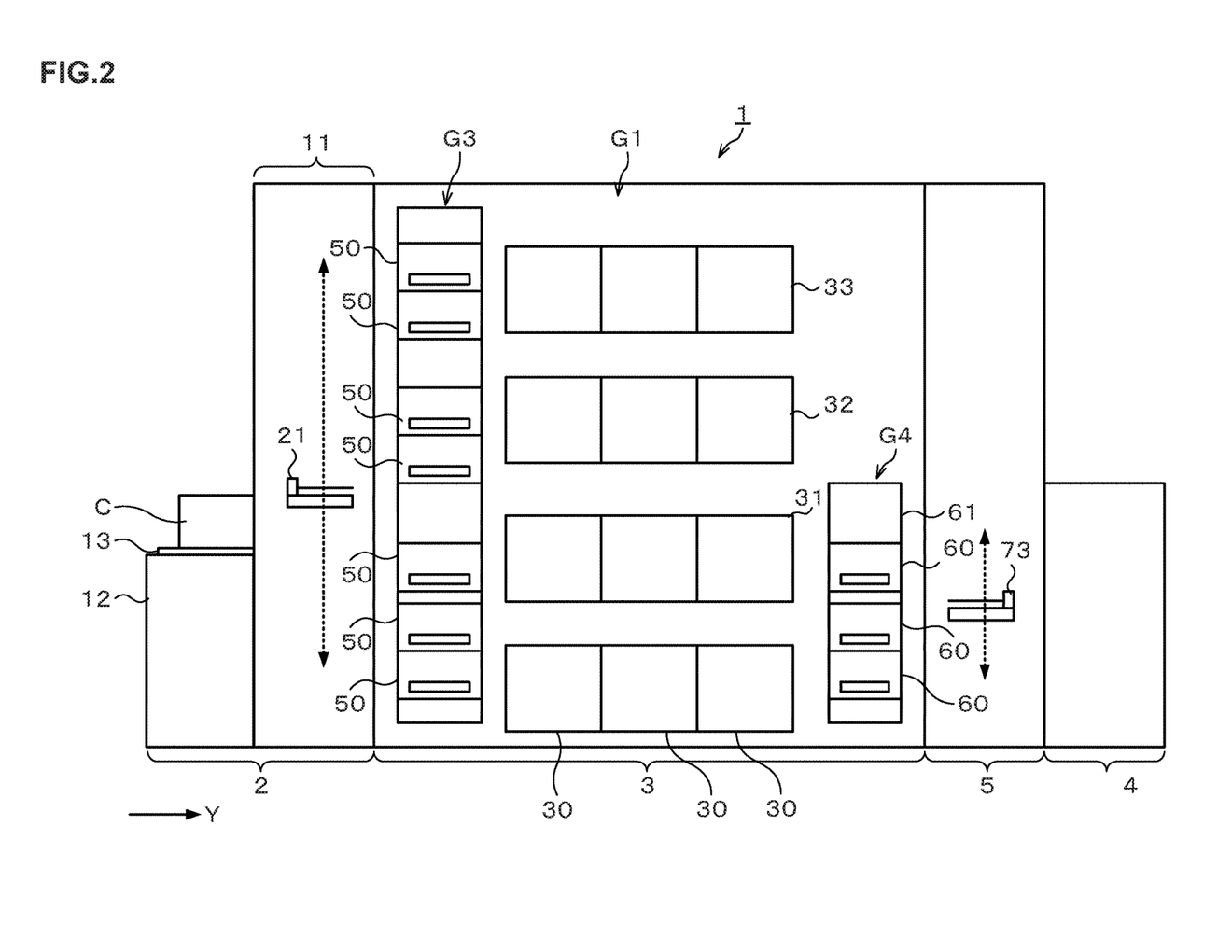
FIG. 2 is a front view illustrating the outline of the configuration of the coating and developing treatment system according to this embodiment.
Figure 3:
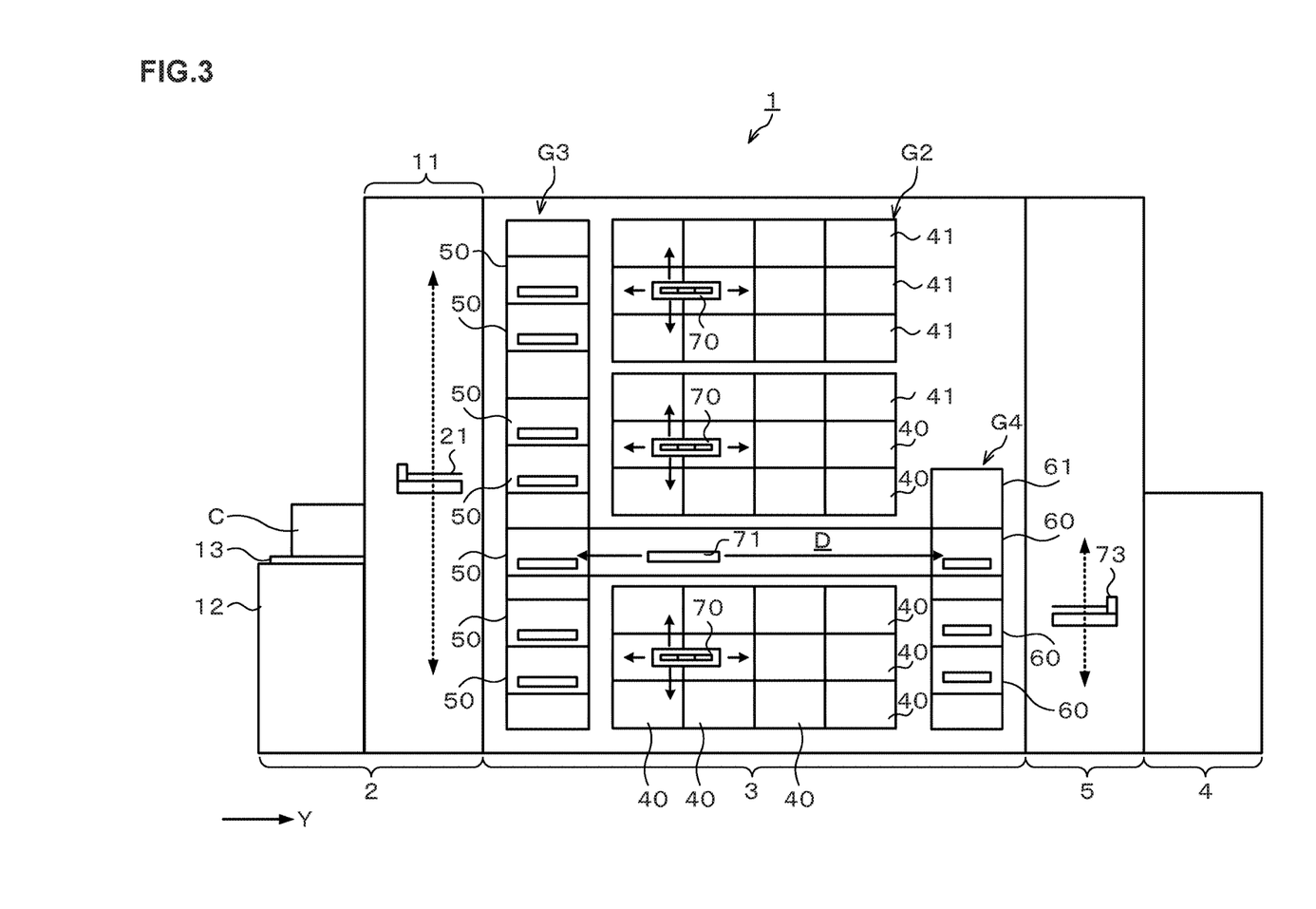
FIG. 3 is a rear view illustrating the outline of the configuration of the coating and developing treatment system according to this embodiment.

FIG. 1 is an explanatory view illustrating the outline of an internal configuration of a coating and developing treatment system 1 as a substrate treatment system according to this embodiment. FIG. 2 and FIG. 3 are a front view and a rear view illustrating the outline of the internal configuration of the coating and developing treatment 1, respectively.

The coating and developing treatment system 1 has, as illustrated in FIG. 1, a configuration in which, for example, a cassette station 2 to/from which a cassette C is transferred in from/out to the outside, a treatment station 3 which includes various treatment apparatuses executing predetermined treatments such as a resist coating treatment and so on, and an interface station 5 which delivers the wafer W to/from an exposure apparatus 4 adjacent to the treatment station 3, are integrally connected. The coating and developing treatment system 1 further includes a control unit 6 which controls the coating and developing treatment system 1.

The cassette station 2 is divided into, for example, a cassette transfer in/out section 10 and a wafer transfer section 11. The cassette transfer in/out section 10 is provided, for example, at an end portion on a Y-direction negative direction (left direction in FIG. 1) side in the coating and developing treatment system 1. In the cassette transfer in/out section 10, a cassette mounting table 12 is provided. On the cassette mounting table 12, a plurality of, for example, four mounting plates 13 are provided. The mounting plates 13 are provided arranged in a line in an X-direction being a horizontal direction (a vertical direction in FIG. 1). On these mounting plates 13, cassettes C can be mounted when the cassettes C are transferred in/out from/to the outside of the coating and developing treatment system 1.

In the wafer transfer section 11, a wafer transfer apparatus 21 is provided which is movable on a transfer path 20 extending in the X-direction as illustrated in FIG. 1. The wafer transfer apparatus 21 is movable also in an up-down direction and around a vertical axis (in a θ-direction), and can transfer the wafer W between the cassette C on each of the mounting plates 13 and a later-described delivery apparatus included in a third block G3 in the treatment station 3.

In the treatment station 3, a plurality of, for example, four first to fourth blocks G1, G2, G3, G4 are provided each including the various apparatuses. For example, the first block G1 is provided on the front side (an X-direction negative direction side in FIG. 1) in the treatment station 3, and the second block G2 is provided on the rear side (an X-direction positive direction side in FIG. 1) in the treatment station 3. Further, the third block G3 is provided on the cassette station 2 side (a Y-direction negative direction side in FIG. 1) in the treatment station 3, and the fourth block G4 is provided on the interface station 5 side (a Y-direction positive direction side in FIG. 1) in the treatment station 3.

In the first block G1, as illustrated in FIG. 2, a plurality of solution treatment apparatuses, for example, a plurality of developing treatment apparatuses 30 each of which performs a developing treatment on the wafer W, a plurality of lower anti-reflection film forming apparatuses 31 each of which forms an anti-reflection film (hereinafter, referred to as a "lower anti-reflection film") at an under layer of a resist film of the wafer W, a plurality of resist coating apparatuses 32 each of which applies a resist solution to the wafer W to form a resist film, and a plurality of upper anti-reflection film forming apparatuses 33 each of which forms an anti-reflection film (hereinafter, referred to as an "upper anti-reflection film") at an over-layer of the resist film of the wafer W, are arranged.

For example, the developing treatment apparatus 30, the lower anti-reflection film forming apparatus 31, the resist coating apparatus 32, and the upper anti-reflection film forming apparatus 33 are arranged three each side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In each of the developing treatment apparatus 30, the lower anti-reflection film forming apparatus 31, and the upper anti-reflection film forming apparatus 33, for example, spin coating of applying a predetermined coating solution onto the wafer W is performed. In the spin coating, the coating solution is discharged, for example, from a coating nozzle onto the wafer W and the wafer W is rotated to diffuse the coating solution over the front surface of the wafer W. Note that the configuration of the resist coating apparatus 32 will be described later.

For example, in the second block G2, as illustrated in FIG. 3, thermal treatment apparatuses 40 each of which performs thermal treatments such as heating and cooling on the wafer W and adhesion apparatuses 41 each for enhancing adhesion between the resist solution and the wafer W, are provided side by side in the vertical direction and in the horizontal direction. The numbers and the arrangement of the thermal treatment apparatuses 40 and the adhesion apparatuses 41 can also be arbitrarily selected.

In the third block G3, a plurality of delivery apparatuses 50 are provided. Further, in the fourth block G4, a plurality of delivery apparatuses 60 are provided and an inspection apparatus 61 is provided thereon. The configurations of the inspection apparatus 61 will be described later.

A wafer transfer region D is formed in a region surrounded by the first block G1 to the fourth block G4 as illustrated in FIG. 1. In the wafer transfer region D, for example, a wafer transfer apparatus 70 is arranged.

The wafer transfer apparatus 70 has a transfer arm 70a movable, for example, in the Y-direction, the front-back direction, the θ-direction, and the up-down direction. The wafer transfer apparatus 70 can move in the wafer transfer region D to transfer the wafer W to a predetermined apparatus in the first block G1, the second block G2, the third block G3 and the fourth block G4 therearound. A plurality of the wafer transfer apparatuses 70 are arranged, for example, in the up-down direction as illustrated in FIG. 3, and can transfer the wafer W, for example, to a predetermined apparatus at a height of the same level in each of the blocks G1 to G4.

Further, in the wafer transfer region D, a shuttle transfer apparatus 71 is provided which linearly transfers the wafer W between the third block G3 and the fourth block G4.

The shuttle transfer apparatus 71 is configured to be linearly movable, for example, in the Y-direction in FIG. 3. The shuttle transfer apparatus 71 can move in the Y-direction while supporting the wafer W, and transfer the wafer W between the delivery apparatus 50 in the third block G3 and the delivery apparatus 60 in the fourth block G4 which are at the height of the same level.

As illustrated in FIG. 1, a wafer transfer apparatus 72 is provided on the X-direction positive direction side of the third block G3. The wafer transfer apparatus 72 has a transfer arm 72a that is movable, for example, in the front-back direction, the θ-direction, and the up-down direction. The wafer transfer apparatus 72 can move up and down while supporting the wafer W to transfer the wafer W to each of the delivery apparatuses 50 in the third block G3.

In the interface station 5, a wafer transfer apparatus 73 and a delivery apparatus 74 are provided. The wafer transfer apparatus 73 has a transfer arm 73a that is movable, for example, in the Y-direction, the θ-direction, and the up-down direction. The wafer transfer apparatus 73, for example, can transfer the wafer W to/from each of the delivery apparatuses 60 in the fourth block G4, the delivery apparatus 74 and the exposure apparatus 4 while supporting the wafer W by the transfer arm 73a.

The aforementioned control unit 6 is, for example, a computer including a program storage unit (not illustrated). In the program storage unit, a program for controlling the operations of the above-described various treatment apparatuses and the drive system for the transfer apparatuses so as to control the treatments on the wafer W including substrate position adjustment processing in the coating and developing treatment system 1 is stored. Note that the program may be the one that is recorded, for example, in a computer-readable storage medium H such as a computer-readable hard disk (HD), flexible disk (FD), compact disk (CD), magneto-optical disk (MO), or memory card, and installed from the storage medium H into the control unit 6.

Figure 4:
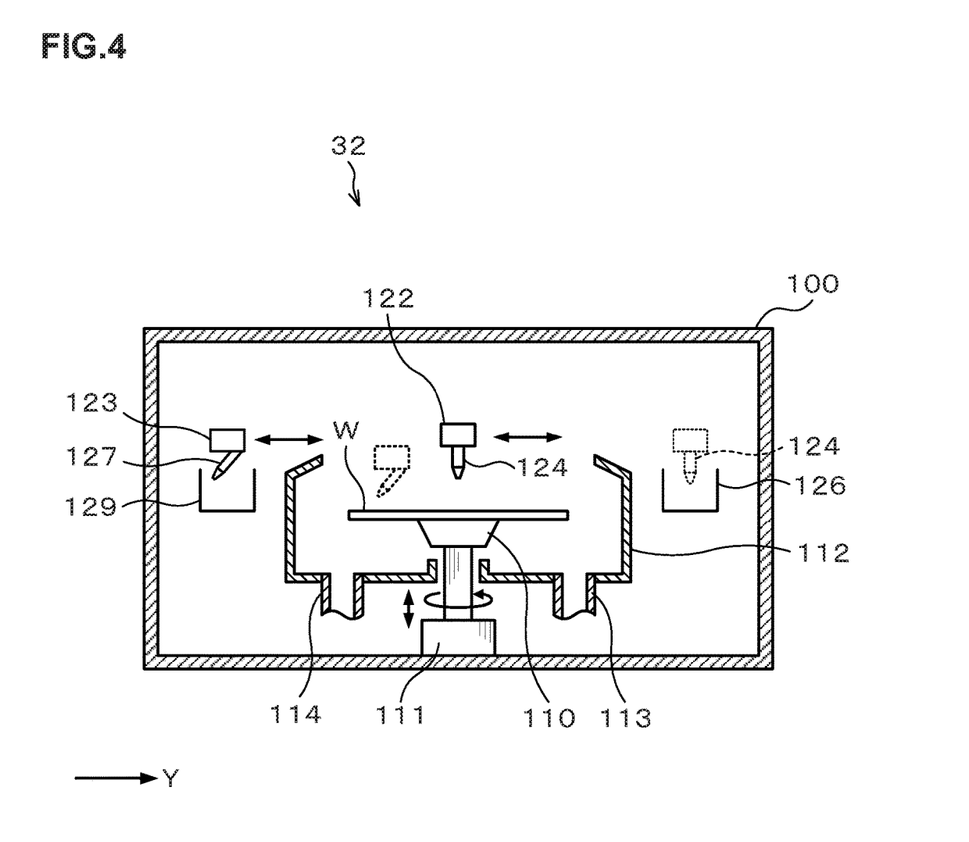
FIG. 4 is a longitudinal sectional view illustrating the outline of a configuration of a resist coating apparatus.
Figure 5:
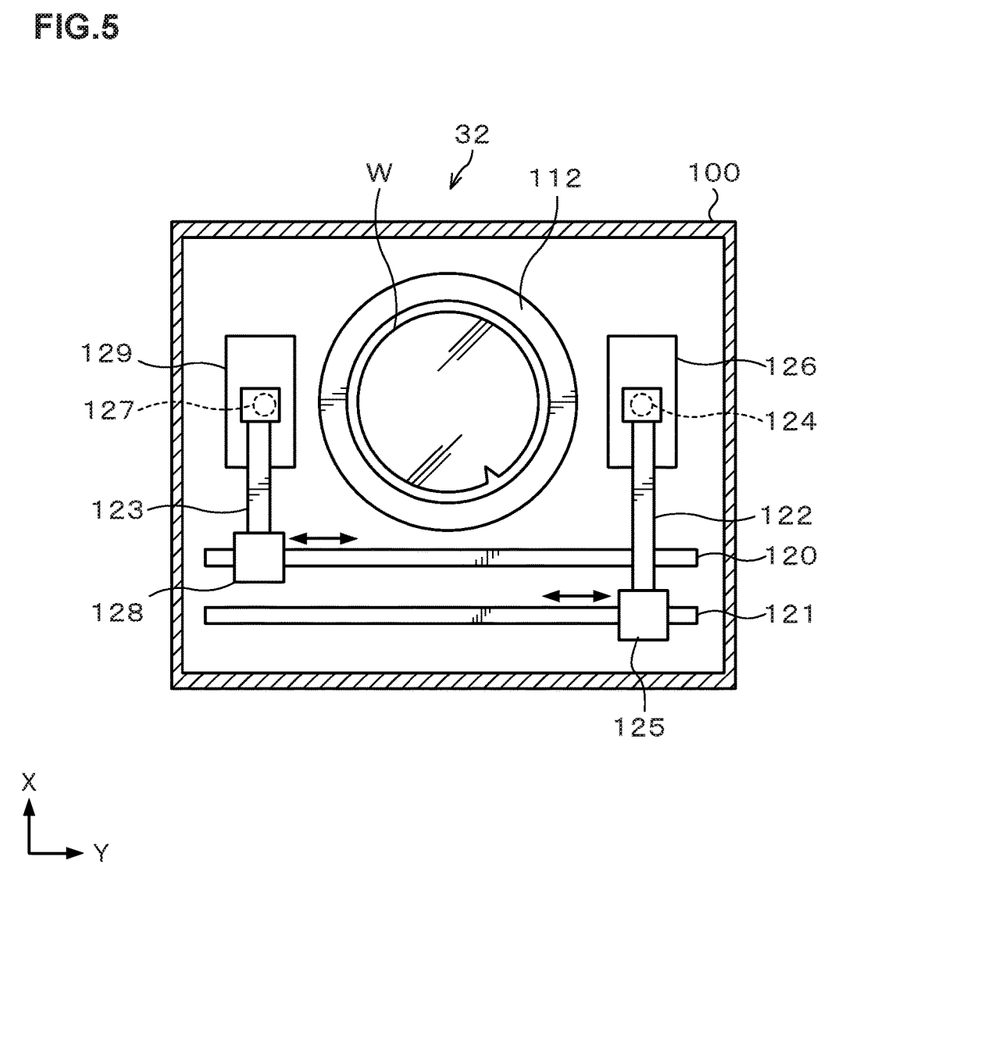
FIG. 5 is a transverse sectional view illustrating the outline of the configuration of the resist coating apparatus.

Next, the configuration of the aforementioned resist coating apparatus 32 will be described. FIG. 4 and FIG. 5 are a longitudinal sectional view and a transverse sectional view illustrating the outline of the configuration of the resist coating apparatus 32, respectively.

The resist coating apparatus 32 has a treatment container 100 whose inside can be closed as illustrated in FIG. 4 and FIG. 5. A side surface on the wafer transfer apparatus 70 side of the treatment container 100 is formed with a transfer-in/out port (not illustrated) for the wafer W, and an opening and closing shutter (not illustrated) is provided at the transfer-in/out port.

At a central portion in the treatment container 100, a spin chuck 110 that holds and rotates the wafer W is provided. The spin chuck 110 has a horizontal upper surface, and the upper surface is provided with, for example, a suction port (not illustrated) for sucking the wafer W. By suction through the suction port, the wafer W can be suction-held on the spin chuck 110.

Below the spin chuck 110, a chuck drive unit 111 including, for example, a motor is provided. The spin chuck 110 can rotate at a predetermined speed by the chuck drive unit 111. Further, the chuck drive unit 111 is provided with, for example, a raising and lowering drive source such as a cylinder so that the spin chuck 110 freely moves up and down.

Around the spin chuck 110, a cup 112 is provided which receives and collects liquid splashing or dropping from the wafer W. A drain pipe 113 for draining the collected liquid and an exhaust pipe 114 for evacuating and exhausting the atmosphere in the cup 112 are connected to the lower surface of the cup 112.

As illustrated in FIG. 5, on an X-direction negative direction (lower direction in FIG. 5) side of the cup 112, rails 120, 121 are formed which extend along a Y-direction (right-left direction in FIG. 5). The rails 120, 121 are formed, for example, from a Y-direction negative direction (left direction in FIG. 5) side outer position to a Y-direction positive direction (right direction in FIG. 5) side outer position of the cup 112. To the rails 120, 121, a first arm 122 and a second arm 123 are attached, respectively.

On the first arm 122, a resist solution supply nozzle 124 which supplies the resist solution onto the wafer W is supported as illustrated in FIG. 4 and FIG. 5. The first arm 122 is movable on the rail 120 by means of a nozzle drive unit 125 illustrated in FIG. 5. This allows the resist solution supply nozzle 124 to move from a waiting section 126 provided at the Y-direction positive direction side outer position of the cup 112 to a position above a center portion of the wafer W in the cup 112. Further, the first arm 122 freely rises and lowers by means of the nozzle drive unit 125 to be able to adjust the height of the resist solution supply nozzle 124.

To the resist solution supply nozzle 124, a not-illustrated resist solution supply source is connected. Further, a not-illustrated supply pipe between the resist solution supply nozzle 124 and the resist solution supply source is provided with a supply equipment group including a valve, a flow regulator and so on for controlling the flow of the resist solution.

On the second arm 123, a solvent supply nozzle 127 is supported which supplies a solvent for the resist film onto the wafer W as illustrated in FIG. 4 and FIG. 5. The second arm 123 is movable on the rail 121 by means of a nozzle drive unit 128 illustrated in FIG. 5. This allows the solvent supply nozzle 127 to move from a waiting section 129 provided at the Y-direction negative direction side outer position of the cup 112 to a position above a peripheral portion of the wafer W in the cup 112. Further, the second arm 123 freely rises and lowers by means of the nozzle drive unit 128 to be able to adjust the height of the solvent supply nozzle 127.

To the solvent supply nozzle 127, a not-illustrated solvent supply source is connected. Further, a not-illustrated supply pipe between the solvent supply nozzle 127 and the solvent supply source is provided with a supply equipment group including a valve, a flow regulator and so on for controlling the flow of the solvent.

Figure 6:
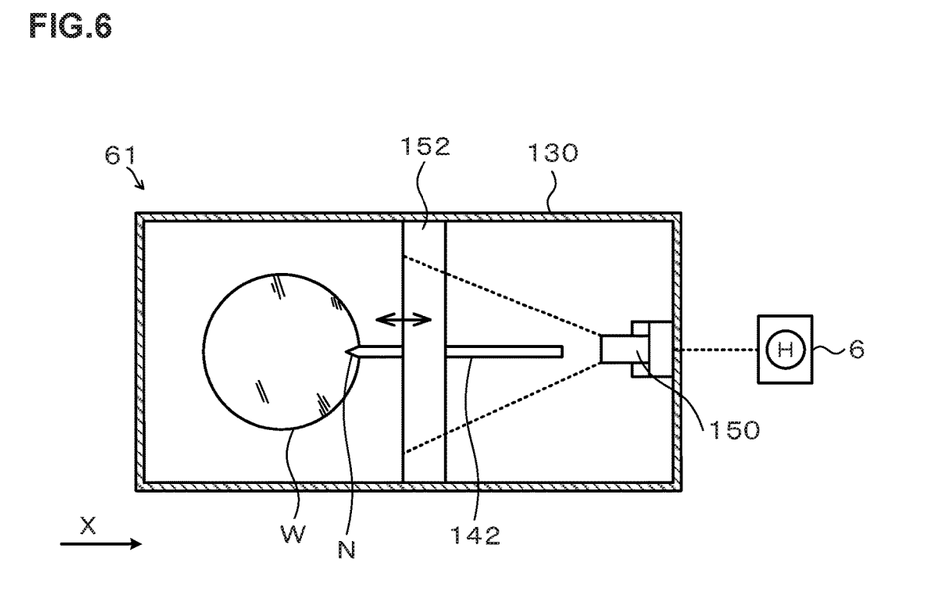
FIG. 6 is a longitudinal sectional view illustrating the outline of a configuration of a defect inspection apparatus.
Figure 7:
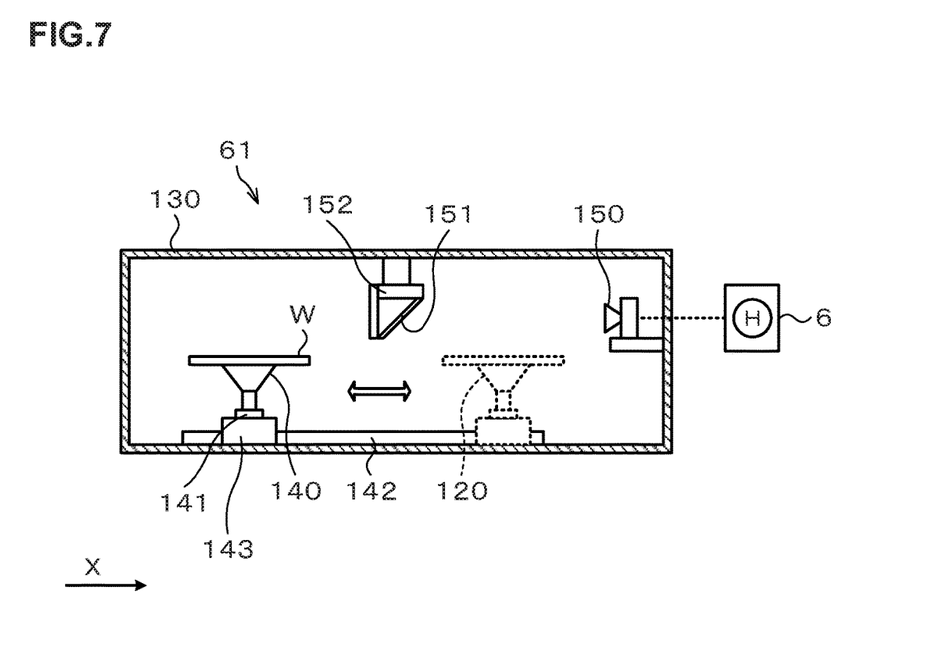
FIG. 7 is a transverse sectional view illustrating the outline of the configuration of the defect inspection apparatus.

Next, the configuration of the inspection apparatus 61 will be described. FIG. 6 and FIG. 7 are a longitudinal sectional view and a transverse sectional view illustrating the outline of the configuration of the inspection apparatus 61, respectively. The inspection apparatus 61 has a casing 130 as illustrated in FIG. 6 and FIG. 7. Inside the casing 130, a mounting table 140 is provided on which the wafer W is mounted. The mounting table 140 freely rotates and stops by means of a rotation drive unit 141 such as a motor. At the bottom surface of the casing 130, a guide rail 142 is provided which extends from one end side (an X-direction negative direction side in FIG. 7) to the other end side (an X-direction positive direction side in FIG. 7) in the casing 130. The mounting table 140 and the rotation drive unit 141 are provided on the guide rail 142 and can move along the guide rail 142 by means of a drive apparatus 143.

On a side surface on the other end side (the X-direction positive direction side in FIG. 7) inside the casing 130, an imaging apparatus 150 is provided. As the imaging apparatus 150, for example, a wide-angle CCD camera is used.

Near the middle of an upper portion of the casing 130, a half mirror 151 is provided. The half mirror 151 is provided at a position facing the imaging apparatus 150 and in such a state that its mirror surface is inclined upward at 45 degrees toward the imaging apparatus 150 from a state of being directed vertically downward. Above the half mirror 151, an illumination apparatus 152 is provided. The half mirror 151 and the illumination apparatus 152 are fixed to the upper surface of the inside of the casing 130. The illumination from the illumination apparatus 152 passes through the half mirror 151 and is applied downward. Accordingly, light reflected by an object existing below the illumination apparatus 152 is further reflected by the half mirror 151 and captured into the imaging apparatus 150. In other words, the imaging apparatus 150 can image the object existing within an irradiation region by the illumination apparatus 152.

Further, in a region in which the periphery of the wafer W is located in the casing, a not-illustrated notch detection unit is provided which detects a notch (an example of a "reference position") N of the wafer W. The notch detection unit includes, for example, a light-emitting part composed of an LED (Light Emitting Diode) or the like provided at a position facing the front surface side of the peripheral portion of the wafer W and a light-receiving part composed of a PD (Photodiode) or the like provided at a position facing the light-emitting part and the rear surface side of the peripheral portion of the wafer W, and detects the notch N of the wafer W based on the change in light quantity incident on the light-receiving part. Note that the notch detection may be performed based on a result of imaging in the imaging apparatus 150.

In the inspection apparatus 61, the orientation of the wafer can be adjusted by the notch detection unit and the rotatable mounting table 140.

Next, the wafer treatment using the coating and developing treatment system 1 will be described.

First, a wafer W is taken out of the cassette C on the cassette mounting table 12 and transferred to the delivery apparatus 50 in the treatment station 3 by the wafer transfer apparatus 21. The wafer W is then transferred by the wafer transfer apparatus 70 to the thermal treatment apparatus 40 in the second block G2 and subjected to a temperature regulation treatment, then subjected to formation of a lower anti-reflection film in the lower anti-reflection film forming apparatus 31, and then transferred to the adhesion apparatus 41 and subjected to an adhesion treatment.

Then, a resist coating treatment and an EBR treatment are executed on the wafer W in the resist coating apparatus 32, whereby a resist film is formed and the resist film at the peripheral portion of the wafer W is removed in an annular shape.

Then, on the wafer W, an upper anti-reflection film is formed in the upper anti-reflection film forming apparatus 33. The wafer W is then transferred to the exposure apparatus 4 and subjected to pattern exposure processing in a predetermined pattern. The wafer W is then transferred to the developing treatment apparatus 30 and subjected to a developing treatment, with which a series of photolithography process in the treatment station 3 ends. The wafer W for which the photolithography process is finished, is transferred to the inspection apparatus 61 in which image data of the entire front surface of the wafer W is acquired by the imaging apparatus 150 of the inspection apparatus 61, and macro defect inspection of the wafer W is performed based on the image data. The wafer W is then housed in the cassette C in sequence.

Figure 8A:
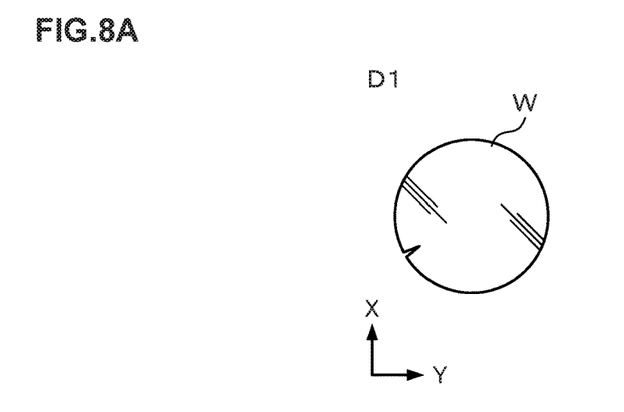
FIG. 8A is a view illustrating the orientation of a wafer in the resist coating apparatus.
Figure 8B:
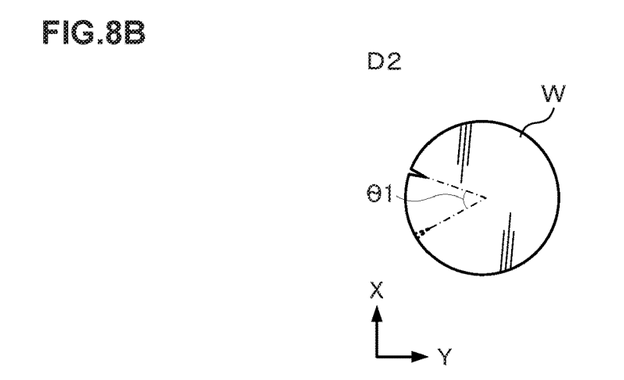
FIG. 8B is a view illustrating the orientation of the wafer in the inspection apparatus at the time of transfer into the inspection apparatus.
Figure 8C:
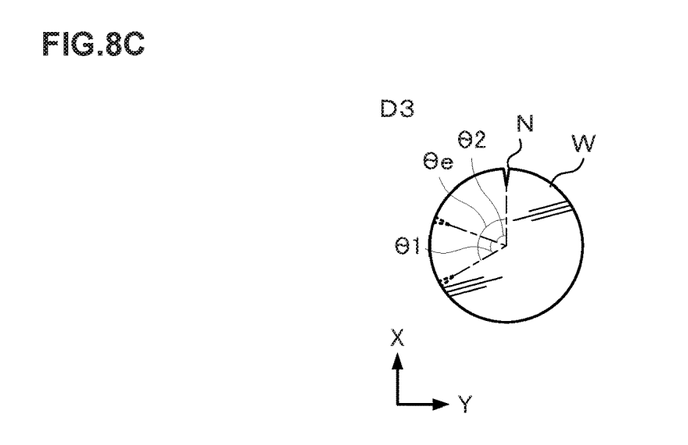
FIG. 8C is a view illustrating the orientation of the wafer at the time of imaging in the inspection apparatus.
Figure 9A:
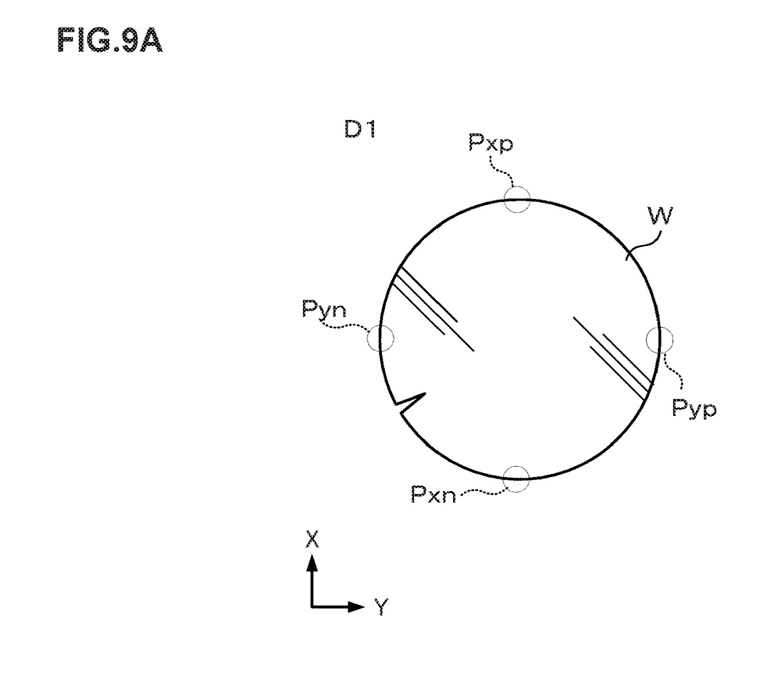
FIG. 9A is a view for explaining the correspondence between a position on the wafer in the resist coating apparatus and a position on the wafer at the time of imaging in the inspection apparatus, and illustrates the wafer in the resist coating apparatus.
Figure 9B:
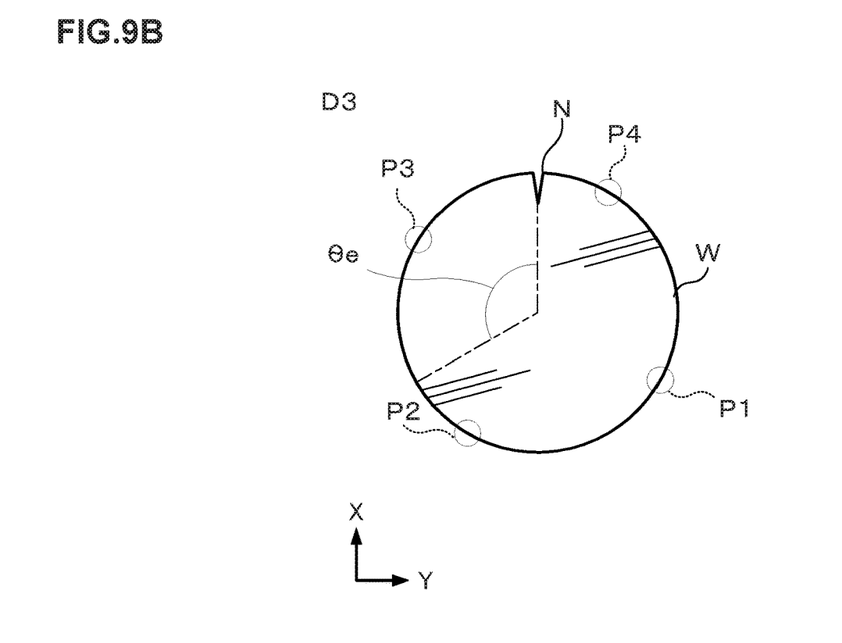
FIG. 9B is a view for explaining the correspondence between the position on the wafer in the resist coating apparatus and the position on the wafer at the time of imaging in the inspection apparatus, and illustrates the wafer at the time of imaging in the inspection apparatus.

Subsequently, the substrate position adjustment processing of adjusting the position of the wafer W at the time of EBR treatment in the coating and developing treatment system 1 will be described using FIG. 8A, FIG. 8B, FIG. 8C, FIG. 9A and FIG. 9B. FIG. 8A is a view illustrating the orientation of the wafer W in the resist coating apparatus 32. FIG. 8B is a view illustrating the orientation of the wafer W in the inspection apparatus 61 at the time when the wafer W is transferred into the inspection apparatus 61. FIG. 8C is a view illustrating the orientation of the wafer W at the time of imaging in the inspection apparatus 61. FIG. 9A and FIG. 9B are views for explaining the correspondence between the position on the wafer W in the resist coating apparatus 32 and the position on the wafer W at the time of imaging in the inspection apparatus 61. FIG. 9A illustrates the wafer W in the resist coating apparatus 32, and FIG. 9B illustrates the wafer W at the time of imaging in the inspection apparatus 61. Note that the substrate position adjustment processing is performed, for example, at the time of starting the coating and developing treatment system 1, at the time of readjusting the position of the wafer W, and at the time of quality management.

In the substrate position adjustment processing, first, a wafer W for adjustment is taken out of the cassette C on the cassette mounting table 12 and transferred to the delivery apparatus 50 in the treatment station 3 by the wafer transfer apparatus 21. Note that the orientation of the wafer W in the cassette C may be arbitrary. Besides, the wafer W for adjustment is, for example, a bare wafer.

Then, the wafer W is held by the transfer arm 70a of the wafer transfer apparatus 70, and the wafer transfer apparatus 70 is moved to the front of the resist coating apparatus 32. The transfer arm 70a of the wafer transfer apparatus 70 holding the wafer W is inserted into the resist coating apparatus 32, and the wafer W is transferred to a delivery position above the spin chuck 110. Thereafter, the wafer W is delivered to the spin chuck 110 which has moved up, and is suction-held by the spin chuck 110. The transfer arm 70a is pulled out of the resist coating apparatus 32, the spin chuck 110 is lowered, and the wafer W is placed at a position where the resist coating treatment and the EBR treatment are performed. Note that the inserting and pulling direction of the transfer arm 70a coincides with the X-direction in the coating and developing treatment system 1 and is a direction intersecting the inserting and pulling direction within a horizontal plane, and the direction in which the wafer transfer apparatus 70 moves within the wafer transfer region D coincides with the Y-direction in the coating and developing treatment system 1.

Subsequently, the first arm 122 moves the resist solution supply nozzle 124 at the waiting section 126 to a position above the center portion of the wafer W. Thereafter, while the spin chuck 110 is rotating the wafer W, the resist solution is supplied from the resist solution supply nozzle 124 onto the wafer W. The supplied resist solution is diffused over the entire front surface of the wafer W by the centrifugal force to form a resist film on the wafer W.

Then, the EBR treatment is executed. Specifically, first, the first arm 122 retracts the resist solution supply nozzle 124 from above the wafer W, and the second arm 123 moves the solvent supply nozzle 127 at the waiting section 129 to a predetermined position near above the peripheral portion of the wafer W. Thereafter, while the spin chuck 110 is rotating the wafer W, the solvent is supplied from the solvent supply nozzle 127 to the peripheral portion of the wafer W. The supplied solvent is diffused from a solvent supply position to a peripheral edge of the wafer W by the centrifugal force to thereby remove the resist film in an annular shape along the peripheral portion of the wafer W.

Note that if the alignment of the wafer W at the time of EBR treatment, namely, the alignment of the delivery position of the wafer W from the transfer arm 70a is inappropriate, the center of the wafer W and a rotation axis of the wafer W, namely, a rotation axis of the spin chuck 110 do not coincide with each other, thus failing to make the removal width of the resist film constant in the circumferential direction.

After the EBR treatment, the wafer W is transferred out of the resist coating apparatus 32 by the wafer transfer apparatus 70. Note that the orientation of the wafer W with respect to the resist coating apparatus 32 at the time of transfer out of the resist coating apparatus 32 is the same as that at the time of transfer thereinto.

The wafer W transferred out of the resist coating apparatus 32 is moved to the front of the inspection apparatus 61 by the wafer transfer apparatus 70. The transfer arm 70a of the wafer transfer apparatus 70 holding the wafer W is inserted into the inspection apparatus 61, and the wafer W is delivered to the mounting table 140. After the delivery, the transfer arm 70a is pulled out of the inspection apparatus 61, with which the transfer of the wafer W into the inspection apparatus 61 ends.

As illustrated in FIG. 8A and FIG. 8B, an orientation D2 of the wafer W at the time of transfer into the inspection apparatus 61 is different from an orientation D1 of the wafer W at the time of transfer-into/out of the resist coating apparatus 32. A change amount $\theta 1$ in orientation of the wafer W is determined by the arrangement relation between the inspection apparatus 61 and the resist coating apparatus 32 in the coating and developing treatment system 1, and information on the change amount $\theta 1$ is stored in the control unit 6 in advance, for example, by input from a user or the like.

After completion of the transfer of the wafer W into the inspection apparatus 61, imaging by the imaging apparatus 150 is performed as described later. Before the imaging, an orientation D3 of the wafer W at the time of imaging is adjusted by the above-described notch detection unit and the mounting table 140 so as to be in a predetermined orientation (for example, an orientation in which the notch N of the wafer W is located at the positive side end in the X-direction) as illustrated in FIG. 8C. Information on a change amount $\theta 2$ in orientation of the wafer W by the adjustment, namely, information on a rotation angle of the mounting table 140 is outputted from the inspection apparatus 61 to the control unit 6.

After the above-described adjustment of the orientation of the wafer W, the front surface of the wafer W is imaged by the imaging apparatus 150, image data on the wafer W is acquired, and the image data is outputted to the control unit 6. The wafer W which has been subjected to imaging is transferred out of the inspection apparatus 61 by the wafer transfer apparatus 70 and returned into the cassette C.

The control unit 6 acquires information on the removal width of the resist film as the information on the result of execution of the EBR treatment, based on the image data acquired using the imaging apparatus 150 of the inspection apparatus 61, namely, an imaging result. The control unit 6 then acquires the information on the change amount $\theta 1$ of the orientation of the wafer W stored in advance, and corrects the position of the wafer W at the time of EBR treatment, based on the above-described information and on the information on the removal width of the resist film.

Hereinafter, a removal width acquisition step of acquiring the above-described information on the removal width of the resist film, and a correction step of correcting the position of the wafer W at the time of EBR treatment, namely, the delivery position of the wafer W will be concretely described. Note that the above removal width acquisition step is an example of a "result information acquisition step" in the present invention.

The orientation D1 of the wafer W in the resist coating apparatus 32 and the orientation D3 of the wafer W at the time of imaging in the inspection apparatus 61 are displaced from each other, and a displacement amount $\theta e$ therebetween is expressed by following Expression (1) using the above-described change amounts $\theta 1$, $\theta 2$ $$\theta e = \theta 1 + \theta 2 \qquad (1).$$

Accordingly, the control unit 6 first adds the above-described change amount θ1 and change amount θ2 and regards the calculation result as the above-described displacement amount θe at a removal information acquisition step. The control unit 6 then calculates removal widths W1 to W4 of the resist film at positions P1 to P4 (see FIG. 9B) displaced by θe, θe+90°, θe+180°, and θe+270° respectively in the circumferential direction from the notch N of the wafer W, based on the image data by the inspection apparatus 61. Information on the removal widths W1 to W4 is outputted as execution result information/correcting information to a step at a subsequent stage. Note that the removal width is the distance from the peripheral edge of the wafer W to the peripheral edge of the resist film. Since light and dark appears at each of a boundary between the resist film on the wafer W and a region where the resist film has been removed and a boundary between a region where the wafer W exists and a region where the wafer W does not exist in the image based on the image data obtained by imaging the wafer W, the removal widths W1 to W4 are calculated based on the light and dark.

Then, the control unit 6 corrects, at the correction step, the delivery position of the wafer W from the transfer arm 70a in the resist coating apparatus 32, based on the information on the removal widths W1 to W4 being the correcting information. Concrete correction is as follows.

As illustrated in FIG. 9A and FIG. 9B, the removal width W1 at the position P1 displaced by θe at the time of imaging by the inspection apparatus 61 corresponds to a removal width X1 at a position Pxp at the positive side end in the X-direction in the resist coating apparatus 32, and the removal width W3 at the position P3 displaced by θe+180° corresponds to a removal width X2 at a position Pxn at the negative side end in the X-direction in the resist coating apparatus 32. The removal width W2 at the position P2 displaced by θe+90° corresponds to a removal width Y1 at a position Pyp at the positive side end in the Y-direction in the resist coating apparatus 32, and the removal width W4 at the position P4 displaced by θe+270° corresponds to a removal width Y2 at a position Pyn at the negative side end in the Y-direction in the resist coating apparatus 32.

Accordingly, the control unit 6 uses, at the correction step, as the relational expression expressing a correction amount at the delivery position of the wafer W from the transfer arm 70a in the resist coating apparatus 32 and indicating a correction amount ΔX in the X-direction, in place of following Expression (2)

$$\Delta X = (X1 - X2)/2 \qquad (2),$$

following Expression (3) to calculate the aforementioned correction amount ΔX $$\Delta X = (W1 - W3)/2 \qquad (3).$$

Further, the control unit 6 uses, as the relational expression expressing a correction amount at the delivery position of the wafer W from the transfer arm 70a in the resist coating apparatus 32 and indicating a correction amount ΔY in the Y-direction, in place of following Expression (4)

$$\Delta Y = (Y1 - Y2)/2 \qquad (4),$$

following Expression (5) to calculate the above correction amount ΔY $$\Delta Y = (W2 - W4)/2 \qquad (5).$$

The control unit 6 then corrects the delivery position of the wafer W to displace it from the position set at present by the correction amounts ΔX, ΔY.

At the time of starting the system, the above steps are preferably performed using a plurality of wafers, namely, a plurality of times. This is because the delivery position of the wafer W before adjustment is sometimes largely displaced from a desired position as compared with that at the time of readjustment and at the time of quality management, and because the delivery position can be adjusted to a more suitable position by performing the steps a plurality of times. At the time of readjustment and at the time of quality management, the above-described series of steps may be performed once and may be performed a plurality of times.

As described above, according to this embodiment, the adjustment of the delivery position of the wafer W from the transfer arm 70a in the resist coating apparatus 32, namely, the position of the wafer at the time of EBR treatment (hereinafter, referred to as an EBR adjustment) is performed based on the information on the change amount θ1 in orientation of the wafer during the movement from the resist coating apparatus 32 to the inspection apparatus 61 and on the result of imaging in the inspection apparatus 61, and therefore the orientation of the wafer W in the cassette C may be arbitrary. In other words, it is unnecessary to adjust the orientation of the wafer W in the cassette C to thereby align it with a specific orientation, thus enabling a reduction in time required for the adjustment. Further, since it is unnecessary to provide an apparatus for adjusting the orientation of the wafer W in the cassette C, for example, an edge exposure apparatus, thus making it possible to prevent an increase in cost and size of the coating and developing treatment system 1. Further, conventionally, in the case where the EBR adjustment is performed with the adjustment of the orientation of the wafer W in the cassette C forgotten, the adjustment is failed, leading to waste time. However, according to this embodiment, the adjustment of the orientation of the wafer W in the cassette C is unnecessary, thus making it possible to prevent adjustment mistake to avoid waste time.

Note that the substrate position adjustment, namely, the position adjustment of the transfer arm 70a in the resist coating apparatus 32 is performed, for example, at the time of starting the coating and developing treatment system 1 in the above description, but the position adjustment of the transfer arm 70a according to this embodiment may be performed during manufacture of a product. Further, the EBR treatment result based on the above-described position displaced by θe in the circumferential direction from the notch N of the wafer W may be used as follows. Specifically, the EBR treatment result may be monitored, and when the removal widths become nonuniform, whether the nonuniformity is caused by a transfer accuracy may be determined.

In the above, calculation of the removal widths of the resist film at four positions displaced by θe, θe+90°, θe+180°, and θe+270° respectively in the circumferential direction from the notch N of the wafer W at the time of imaging in the inspection apparatus 61 is described for easy explanation.

Actually, the removal widths in regions displaced by 15° each along the circumferential direction of the wafer W, namely, at 24 regions in total are calculated. Then, the removal width in a region including one of the above-described four positions or the removal width in a region closest to one of the above-described four positions is used for calculation of the correction amount as the removal width at the position.

Further, in the case of acquiring the removal widths in the 24 regions are acquired as described above, the control unit 6 may output, for other arithmetic operations, the information on the removal widths in a region θ0 where the notch N of the wafer W exists and regions displaced by 90°, 180°, and 270° respectively in the circumferential direction from θ0 (hereinafter, the removal widths at four points based on the notch).

The information on the removal widths at the four points based on the notch is used, for example, for the following arithmetic operations. The calculation result of the removal width of the resist film based on the imaging result differs between apparatuses due to the difference in position of the imaging apparatus 150 in the inspection apparatus 61 between apparatuses in some cases. Further, since a bevel is formed at the peripheral edge of the wafer W, the removal width of the resist film calculated from the imaging result differs from the actual removal width. The apparatus that measures the actual removal width normally outputs the removal widths at the four points based on the notch. Therefore, to accurately take the correlation between the actual removal width and the removal width of the resist film calculated from the imaging result, the information on the removal widths at the four points based on the notch is outputted.

Though only the adjustment of the position of the wafer W at the time of EBR treatment is performed in the above description, the position adjustment of the solvent supply nozzle 127 at the time of EBR treatment is also performed.

This position adjustment is performed, for example, based on an average value of the removal widths of the resist film. For example, when the average value is larger than a predetermined value, the position of the solvent supply nozzle 127 is adjusted to a position closer to the peripheral edge side of the wafer W than is the original position, whereas when the average value is smaller than the predetermined value, the position of the solvent supply nozzle 127 is adjusted to a position closer to the center side of the wafer W than is the original position. The average value of the removal widths used for the position adjustment of the solvent supply nozzle 127 may be an average value of the removal widths of the resist film at the four positions displaced by θe, θe+90°, θe+180°, and θe+270° respectively in the circumferential direction from the notch N of the wafer W at the time of imaging in the inspection apparatus 61, may be an average value of the four removal widths based on the notch, or may be an average value of the removal widths in the above-described 24 regions.

Though an operation of reversing the front and the rear of the wafer W is not performed in the coating and developing treatment system 1 in the above example, the present invention is also applicable to a substrate treatment system that performs such a reversing operation.

Further, though the adjustment method of the position of the wafer W at the time of EBR treatment is described in the above, the present invention is also applicable to an adjustment method of the position of the wafer W in a rotation treatment other than the EBR treatment, for example, a treatment of forming an annular film along an outer edge of the wafer.

The technique according to this disclosure is useful in a technique of aligning a substrate at a time of a rotation treatment in a substrate treatment system that executes the rotation treatment being a predetermined treatment performed on the substrate while rotating the substrate.

The embodiment disclosed herein should be considered to be an example in all respects but not restrictive. The above embodiment may be subjected to omission, change and modification in various forms without departing from the scope and the spirit of accompanying claims.

What is claimed is:

1. A substrate position adjustment method for adjusting a position of a substrate at a time of a rotation treatment in a substrate treatment system comprising a rotation treatment apparatus configured to execute the rotation treatment, the rotation treatment being a predetermined treatment performed on the substrate while rotating the substrate,
the substrate treatment system comprising an inspection apparatus configured to image a front surface of the substrate for inspection of the substrate,
the substrate position adjustment method comprising:
a rotation treatment step of executing the rotation treatment in the rotation treatment apparatus;
an imaging step of imaging the substrate on which the rotation treatment has been executed, in the inspection apparatus;
a change amount information acquisition step of acquiring change amount information stored in advance, being information on an amount of change in orientation of the substrate while the substrate is moved from the rotation treatment apparatus to the inspection apparatus;
a result information acquisition step of acquiring, as an execution result information, information on an execution result of the rotation treatment along a circumferential direction of the substrate, based on an imaging result at the imaging step; and
a correction step of correcting the position of the substrate at the time of the rotation treatment, based on at least the change amount information and the execution result information.

2. The substrate position adjustment method according to claim 1, further comprising:
a rotation step of rotating the substrate to make the orientation of the substrate at the imaging step a predetermined orientation; and
another change amount information acquisition step of acquiring another change amount information being information on an amount of change in orientation of the substrate at the rotation step,
wherein the correction step corrects the position of the substrate at the time of the rotation treatment, based on the change amount information, the another change amount information, and the execution result information.

3. The substrate position adjustment method according to claim 2,
wherein the result information acquisition step
calculates a sum θe of an amount θ1 of change in orientation of the substrate while the substrate is moved from the rotation treatment apparatus to the inspection apparatus and a change amount θ2 in orientation of the substrate at the rotation step, and
acquires, as the execution result information, information of an execution result of the rotation treatment at positions displaced by θe, θe+90°, θe+180°, and θe+270° respectively in the circumferential direction from a reference position of the substrate.

4. The substrate position adjustment method according to claim 3, further comprising:
a step of acquiring and outputting information on an execution result of the rotation treatment at the reference position of the substrate and positions displaced by 90°, 180°, and 270° respectively in the circumferential direction from the reference position.

5. A computer-readable storage medium storing a program running on a computer of a control unit configured to control a substrate treatment system to cause the substrate treatment system to execute a substrate position adjustment method for adjusting a position of a substrate at a time of a rotation treatment in the substrate treatment system comprising a rotation treatment apparatus configured to execute the rotation treatment, the rotation treatment being a predetermined treatment performed on the substrate while rotating the substrate, the substrate treatment system comprising an inspection apparatus configured to image a front surface of the substrate for inspection of the substrate, the substrate position adjustment method comprising:

a rotation treatment step of executing the rotation treatment in the rotation treatment apparatus;

an imaging step of imaging the substrate on which the rotation treatment has been executed, in the inspection apparatus;

a change amount information acquisition step of acquiring change amount information stored in advance, being information on an amount of change in orientation of the substrate while the substrate is moved from the rotation treatment apparatus to the inspection apparatus;

a result information acquisition step of acquiring, as an execution result information, information on an execution result of the rotation treatment along a circumferential direction of the substrate, based on an imaging result at the imaging step; and a correction step of correcting the position of the substrate at the time of the rotation treatment, based on at least the change amount information and the execution result information.

6. A substrate treatment system comprising a rotation treatment apparatus configured to execute a rotation treatment, the rotation treatment being a predetermined treatment performed on the substrate while rotating the substrate, the substrate treatment system comprising:

an inspection apparatus configured to image a front surface of the substrate for inspection of the substrate; and a control unit configured to adjust a position of the substrate at a time of the rotation treatment, wherein the control unit is configured to control the rotation treatment apparatus and the inspection apparatus so as to perform:

a rotation treatment step of executing the rotation treatment in the rotation treatment apparatus; and an imaging step of imaging the substrate on which the rotation treatment has been executed, in the inspection apparatus; and, through control of the control unit, to perform:

a change amount information acquisition step of acquiring change amount information stored in advance, being information on an amount of change in orientation of the substrate while the substrate is moved from the rotation treatment apparatus to the inspection apparatus;

a result information acquisition step of acquiring, as an execution result information, information on an execution result of the rotation treatment along a circumferential direction of the substrate, based on an imaging result at the imaging step; and a correction step of correcting the position of the substrate at the time of the rotation treatment, based on at least the change amount information and the execution result information.

* * * * *